(12) United States Patent
Zhao et al.

(10) Patent No.: US 11,462,687 B2
(45) Date of Patent: Oct. 4, 2022

(54) DISPLAY BACKPLATE AND FABRICATING METHOD THEREOF, AND DISPLAY APPARATUS

(71) Applicant: BOE TECHNOLOGY GROUP CO., LTD., Beijing (CN)

(72) Inventors: Dejiang Zhao, Beijing (CN); Guangcai Yuan, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 258 days.

(21) Appl. No.: 16/764,081

(22) PCT Filed: Dec. 4, 2019

(86) PCT No.: PCT/CN2019/122969
§ 371 (c)(1),
(2) Date: May 14, 2020

(87) PCT Pub. No.: WO2020/192170
PCT Pub. Date: Oct. 1, 2020

(65) Prior Publication Data
US 2021/0226125 A1    Jul. 22, 2021

(30) Foreign Application Priority Data
Mar. 25, 2019   (CN) .......................... 201910227029.6

(51) Int. Cl.
*H01L 51/00*    (2006.01)
*C25D 13/12*    (2006.01)
(Continued)

(52) U.S. Cl.
CPC .......... *H01L 51/0006* (2013.01); *C25D 13/12* (2013.01); *C25D 13/20* (2013.01);
(Continued)

(58) Field of Classification Search
None
See application file for complete search history.

(56) References Cited

U.S. PATENT DOCUMENTS

| | | |
|---|---|---|
| 2008/0072468 A1 | 3/2008 | Sumiyoshi et al. |
| 2009/0002454 A1 | 1/2009 | Chen |
| (Continued) | | |

FOREIGN PATENT DOCUMENTS

| | | |
|---|---|---|
| CN | 1717134 A | 1/2006 |
| CN | 101201996 A | 6/2008 |
| (Continued) | | |

OTHER PUBLICATIONS

Machine language translation of CN 107046097 A. (Year: 2017).*
(Continued)

*Primary Examiner* — Erik Kielin
(74) *Attorney, Agent, or Firm* — WHDA, LLP

(57) ABSTRACT

The embodiments of the present disclosure provide a method of fabricating a display backplate. The method of fabricating the display backplate may include forming a channel layer on a surface of a substrate. The channel layer may include a liquid storage portion, a plurality of pixel channels, and a plurality of moving electrodes. Each of the plurality of pixel channels may include a plurality of sub-pixel grooves. The method of fabricating the display backplate may further include printing ink droplets into the liquid storage portion and moving the ink droplets into the plurality of sub-pixel grooves by applying a moving voltage to the moving electrodes.

18 Claims, 9 Drawing Sheets

(51) Int. Cl.
  *C25D 13/20* (2006.01)
  *H01L 27/32* (2006.01)
  *H01L 51/50* (2006.01)
  *H01L 51/56* (2006.01)

(52) U.S. Cl.
  CPC ........ *H01L 27/322* (2013.01); *H01L 27/3246* (2013.01); *H01L 51/0005* (2013.01); *H01L 51/0026* (2013.01); *H01L 51/5012* (2013.01); *H01L 51/56* (2013.01); *H01L 2227/323* (2013.01); *H01L 2251/5369* (2013.01)

(56) References Cited

U.S. PATENT DOCUMENTS

| | | |
|---|---|---|
| 2012/0309255 A1 | 12/2012 | Goda |
| 2013/0163068 A1 | 6/2013 | Matsuoka et al. |
| 2019/0123412 A1 | 4/2019 | Michaelis et al. |

FOREIGN PATENT DOCUMENTS

| | | | | |
|---|---|---|---|---|
| CN | 101332708 A | | 12/2008 | |
| CN | 102754529 A | | 10/2012 | |
| CN | 107046097 A | * | 8/2017 | ........... H01L 27/283 |
| CN | 107579099 A | | 1/2018 | |
| CN | 108099408 A | | 6/2018 | |
| CN | 109155197 A | | 1/2019 | |
| CN | 109920940 A | | 6/2019 | |

OTHER PUBLICATIONS

International Search Report dated Mar. 6, 2020, issued in counterpart application No. PCT/CN2019/122969 (11 pages).

Office Action dated Jan. 2, 2020, issued in counterpart CN application No. 201910227029.6, with English translation. (20 pages).

* cited by examiner

DISPLAY BACKPLATE AND FABRICATING METHOD THEREOF, AND DISPLAY APPARATUS

CROSS-REFERENCE TO RELATED APPLICATIONS

This application claims benefit of the filing date of Chinese Patent Application No. 201910227029.6 filed on Mar. 25, 2019, the disclosure of which is hereby incorporated in its entirety by reference.

TECHNICAL FIELD

The disclosure relates to the field of display technology, in particular, to a display backplate and fabricating method thereof, and a display apparatus.

BACKGROUND

In the field of organic light-emitting diode (OLED) display product manufacturing technology, production of high-resolution products is a major problem in the solution process, and the number of pixels of the OLED display screen usually does not exceed 400 ppi.

However, both augmented reality (AR) and virtual reality (VR) belong to near-eye display technology, and the near-eye display technology requires higher resolution of the product. Usually, the pixel number of the display screen is higher than 100 ppi. Therefore, in the prior art, the white organic light emitting diode (WOLED) is generally selected to be combined with a color film (CF) design. However, this technology has disadvantages such as high operating voltage and large power consumption.

BRIEF SUMMARY

An embodiment of the present disclosure provides a method of fabricating a display backplate. The method of fabricating the display backplate may include forming a channel layer on a surface of a substrate. The channel layer may include a liquid storage portion, a plurality of pixel channels, and a plurality of moving electrodes. Each of the plurality of pixel channels may include a plurality of sub-pixel grooves. The plurality of moving electrodes may include first moving electrodes and second moving electrodes, each of the first moving electrodes may be between the liquid storage portion and one of the plurality of pixel channels, each of the second moving electrodes may be between adjacent sub-pixel grooves. The method of fabricating the display backplate may further include printing ink droplets into the liquid storage portion and moving the ink droplets into the plurality of sub-pixel grooves by applying a moving voltage to the moving electrodes.

Optionally, moving the ink droplets into the plurality of sub-pixel grooves by applying the moving voltage to the moving electrodes comprises applying a first moving voltage to one of the first moving electrodes so that some of the ink droplets moves from the liquid storage portion to one of the plurality of pixel channels and applying a second moving voltage to the second moving electrodes in the one of the plurality of pixel channels, so that the plurality of sub-pixel grooves in the one of the plurality of pixel channels are filled with a portion of the ink droplets, respectively.

Optionally, the liquid storage portion comprises a first liquid storage structure and a plurality of second liquid storage structures, the first liquid storage structure is connected to the plurality of second liquid storage structures, the moving electrodes further comprises third moving electrodes, each of the third moving electrodes is between the first liquid storage structure and one of the plurality of second liquid storage structures, and each of the plurality of second liquid storage structures is connected to more than one of the plurality of pixel channels, each of the first moving electrodes is between one of the plurality of second liquid storage structures and one of the plurality of pixel channels, and printing the ink droplets into the liquid storage portion comprises printing the ink droplets into the first liquid storage structure.

Optionally, each of the plurality of second liquid storage structures is connected to three pixel channels, and the three pixel channels comprises a red pixel channel having a plurality of red sub-pixel grooves, a green pixel channel having a plurality of green sub-pixel grooves, and a blue pixel channel having a plurality of blue sub-pixel grooves.

Optionally, the channel layer further comprises a plurality of pixel peripheral electrodes, the plurality of pixel peripheral electrodes comprises first pixel peripheral electrodes, second pixel peripheral electrodes and a third pixel peripheral electrode and each of the first pixel peripheral electrodes surrounds one of the plurality of second liquid storage structures, each of the second pixel peripheral electrodes surrounds one of the plurality of sub-pixel grooves, the third pixel peripheral electrode surrounds the first liquid storage structure.

Optionally, moving the ink droplet into the plurality of sub-pixel grooves by applying the moving voltage to the moving electrodes comprises applying a first liquid level boosting voltage to the third pixel peripheral electrode surrounding the first liquid storage structure, thereby raising a liquid level of the ink droplets in the first liquid storage structure; and applying a third moving voltage to the third moving electrodes between the first liquid storage structure and the plurality of the second liquid storage structures, thereby moving some of the ink droplets from the first liquid storage structure into the plurality of second liquid storage structures connected to the first liquid storage structure; applying a second liquid level boosting voltage to each of the first pixel peripheral electrodes surrounding the plurality of second liquid storage structures connected to the first liquid storage structure, thereby raising a liquid level of the ink droplets in each of the plurality of second liquid storage structures; and applying a first moving voltage to each of the first moving electrodes between the plurality of the second liquid storage structures and the plurality of pixel channels, thereby moving the ink droplets sequentially from the plurality of second liquid storage structures into the plurality of sub-pixel grooves in the plurality of pixel channels connected to the plurality of second liquid storage structures; applying a third liquid level boosting voltage to each of the second pixel peripheral electrodes surrounding the first sub-pixel grooves, thereby raising a liquid level of the ink droplets in each of the first sub-pixel grooves, and applying a second moving voltage to each of the second moving electrodes between the adjacent sub-pixel grooves, thereby moving some of ink droplets from one of the sub-pixel grooves to another adjacent one of sub-pixel grooves sequentially.

Optionally, the first liquid level boosting voltage, the second liquid level boosting voltage, and the third liquid level boosting voltage are the same; and the first moving voltage, the second moving voltage, and the third moving voltage are the same.

Optionally, the ink droplets are charged, charge polarity of the ink droplets is opposite to charge polarity of the first moving voltage, the second moving voltage, and the third moving voltage, and the charge polarity of the ink droplets is the same as charge polarity of the liquid level boosting voltage.

Optionally, the ink droplets comprises a light-emitting material, the method further comprising drying the substrate filled with the ink droplets in the sub-pixel grooves, thereby obtaining a light-emitting layer in each of the sub-pixel grooves.

Optionally, the ink droplets comprises a quantum dot, the method further comprises drying the substrate filled with the ink droplets in the sub-pixel grooves, thereby obtaining a color filter layer comprising the quantum dot in each of the sub-pixel grooves.

Optionally, the method further comprises cutting off a region of substrate where the liquid storage portion is, thereby obtaining the display backplate comprising the plurality of pixel channels and the plurality of second moving electrodes.

One embodiment of the present disclosure is a display backplate, comprising a substrate; a channel layer on a surface of the substrate, the channel layer comprising a plurality of pixel channels, each of the pixel channels comprising a plurality of sub-pixel grooves, and second moving electrodes between adjacent sub-pixel grooves in a same pixel channel; and a sub-pixel layer in each of the plurality of sub-pixel grooves respectively.

Optionally, the sub-pixel layer comprises a light-emitting material or a quantum dot.

Optionally, the channel layer further comprises a plurality of pixel peripheral electrodes and a plurality of spacers, and each of the pixel peripheral electrodes respectively surrounds one of the sub-pixel grooves, and each of the plurality of spacers is configured to separate two adjacent sub-pixel grooves.

Optionally, the pixel peripheral electrodes are disposed in a different layer from the second moving electrodes and insulated from the second moving electrodes.

Optionally, the channel layer further comprises a liquid storage portion, and the liquid storage portion is connected to the plurality of pixel channels through first moving electrodes.

Optionally, the liquid storage portion comprises a first liquid storage structure and a plurality of second liquid storage structures, the first liquid storage structure is connected to the plurality of second liquid storage structures, and each of the plurality of second liquid storage structures is connected to more than one of the plurality of pixel channels.

Optionally, a height of one of the second liquid storage structures is smaller than a height of the first liquid storage structure and greater than a height of one of the pixel channels.

Optionally, the channel layer further comprises first moving electrodes and third moving electrodes, each of the third moving electrodes is between the first liquid storage structure and one of the plurality of second liquid storage structures, each of the first moving electrodes is between each of the plurality of second liquid storage structures and one of plurality of pixel channels, and a surface of one of the first moving electrodes, the second moving electrodes, or the third moving electrodes opposite from the substrate is covered with a hydrophobic insulating layer.

One embodiment of the present disclosure is a display apparatus comprising the display backplate according to one embodiment of the present disclosure.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

Figure 1:
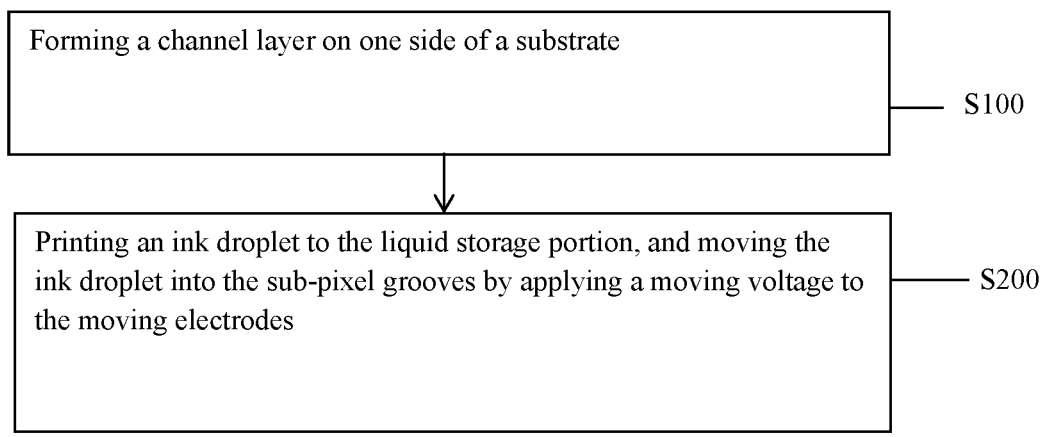
FIG. 1 is a schematic flow chart of a method for fabricating a display backplate according to one embodiment of the present disclosure.

The present disclosure will be further described in detail with reference to the accompanying drawings. When referring to the figures, like structures and elements shown throughout are indicated with like reference numerals. Obviously, the described embodiments are only a part of the embodiments of the present disclosure, not all of the embodiments. All other embodiments obtained by a person of ordinary skill in the art based on the embodiments of the present disclosure without creative efforts are within the protection scope of the present disclosure. In the description of the following embodiments, specific features, structures, materials or characteristics may be combined in any suitable manner in any one or more embodiments or examples.

The shapes and sizes of the various components in the drawings do not reflect true proportions, and are merely intended to illustrate the present disclosure.

The words "including" or "comprising" and the like mean that the element or the item preceding the word includes the element or item listed after the word and its equivalent and do not exclude other components or objects. A numerical value modified by "about" herein means that the numerical value can vary by 10% thereof.

One embodiment of the present disclosure provides a method of fabricating a display backplate. According to one embodiment of the present disclosure, referring to FIG. 1, the fabricating method includes the following steps:

Step S100 includes forming a channel layer on one side of a substrate.

Figure 2:
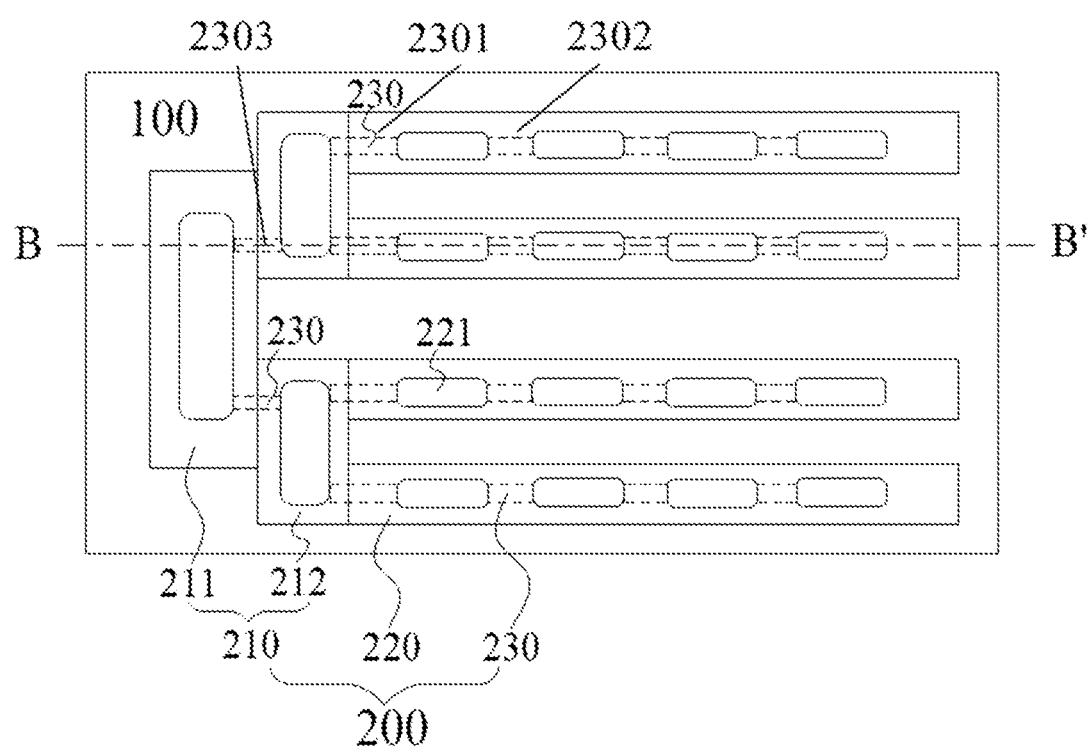
FIG. 2 is a top plan view showing a display backplate according to one embodiment of the present disclosure.

In this step, the channel layer 200 is formed on one side or surface of the substrate 100, and referring to FIG. 2, the channel layer 200 includes a liquid storage portion 210, a plurality of pixel channels 220, and a plurality of moving electrodes 230. The moving electrodes include first moving electrodes 2301, second moving electrodes 2302, and third moving electrodes 2303. The liquid storage portion 210 is connected to the plurality of pixel channels 220. Each of the first moving electrodes is between the liquid storage portion and one of the plurality of pixel channels. Each of the pixel channels 220 has a plurality of sub-pixel grooves 221, and two adjacent sub-pixel grooves 221 are connected. each of the second moving electrodes is between adjacent sub-pixel grooves According to some embodiments of the present disclosure, the specific number of stages of the liquid storage portions 210 is not particularly limited. In one embodiment, the number of stages of the liquid storage portions 210 is more than or equal to two levels. Those skilled in the art can design correspondingly according to the actual number of pixels required.

In some embodiments, as shown in FIG. 2, the liquid storage portion 210 may be a two-stage liquid storage structure, and the liquid storage portion 210 includes at least a plurality of first liquid storage structures 211 and a plurality of second liquid storage structures 212. Each of the first liquid storage structures 211 is connected to a plurality of second liquid storage structures 212. Each of the third moving electrodes is between the first liquid storage structure and one of the plurality of second liquid storage structures. A first moving electrode is disposed between each of the second liquid storage structures 212 and each of the plurality of pixel channels 220. Each of the second liquid storage structures 212 is connected to a plurality of pixel channels 220 Thus, referring to FIG. 3, ink droplets subsequently printed in the first liquid storage structure 211 can be moved to the second liquid storage structures 212 under the electric field of the third moving electrodes 2303, and then moved to the sub-pixel grooves 221 under the electric field of the first and second moving electrodes, thereby enabling electrical printing of a light-emitting layer of a high pixel number after two times of shunting or splitting flow.

Figure 4:
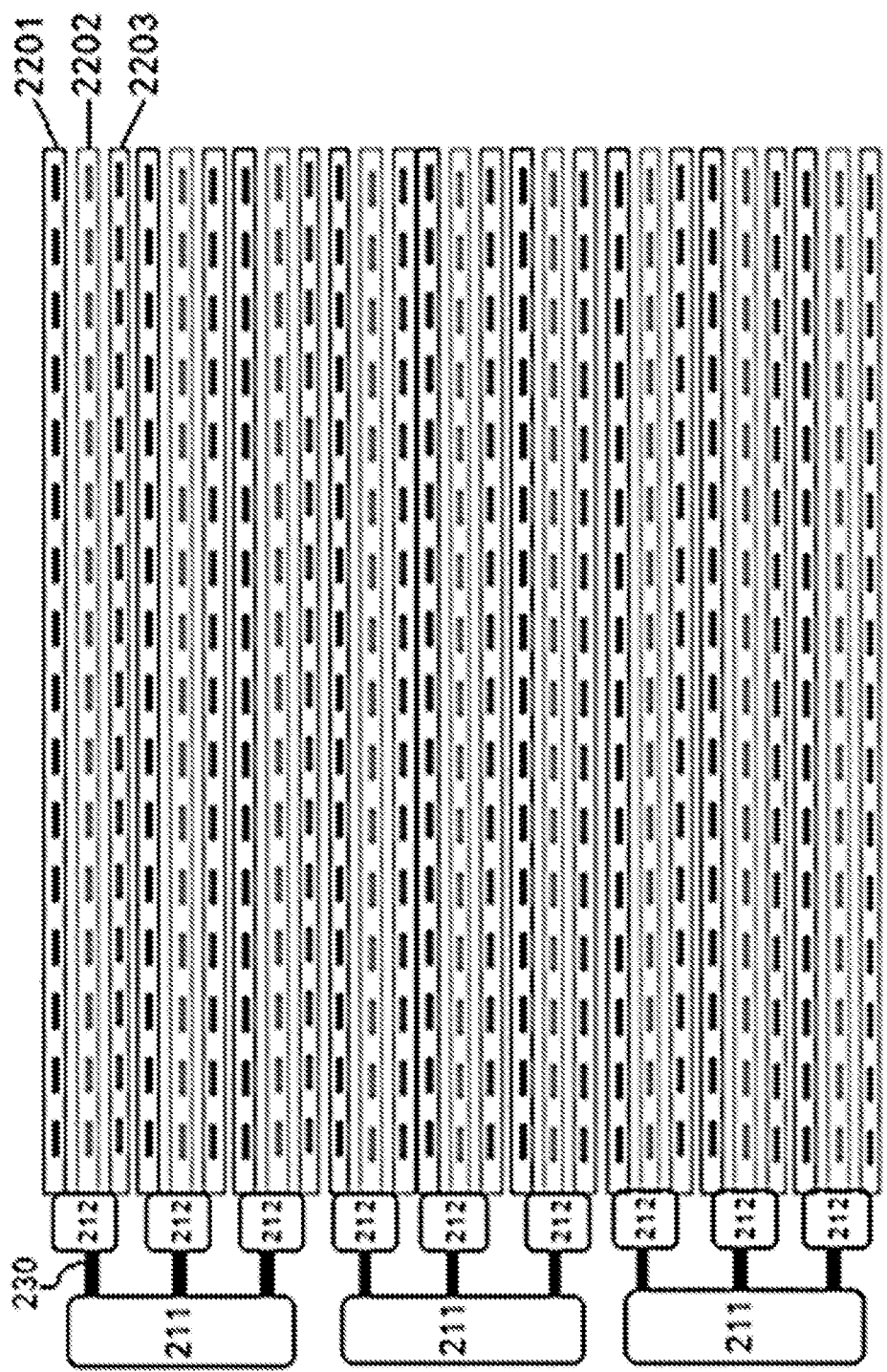
FIG. 4 is a schematic top plan view of a display panel according to one embodiment of the present disclosure.

In some embodiments, referring to FIG. 4, each of the first liquid storage structures 211 may be connected to three second liquid storage structures 212, and each of the second liquid storage structures 212 may be connected to three pixel channels. Thus, the small size of the ink droplets shunted into the sub-pixel grooves 221 can make the number of pixels of the finally produced display backplate higher than 1000 ppi. Furthermore, the three pixel channels connected to the same second liquid storage structure 212 can be respectively a red pixel channel 2201, a green pixel channel 2202, and a blue pixel channel 2203.

In some embodiments of the present disclosure, the liquid storage portion 210 may be a three-stage liquid storage structure, and each of the second liquid storage structures 212 is connected to a plurality of third liquid storage structures 213, and each of the third liquid storage structures is connected to a plurality of pixel channels 220. Each of the first moving electrodes is between the liquid storage portion and one of the plurality of pixel channels. Thus, the charged ink droplets subsequently printed in the first liquid storage structure 211 can be moved to the second liquid storage structures 212 under the electric field of the third moving electrodes 2303, and then moved to the third liquid storage structures under the electric field of the moving electrodes 230, and then moved to the sub-pixel grooves 221 under the electric field of the first moving electrodes 2301, thereby enabling electrical printing of a light-emitting layer of a higher pixel number after three times of shunting or splitting flow.

Figure 5:
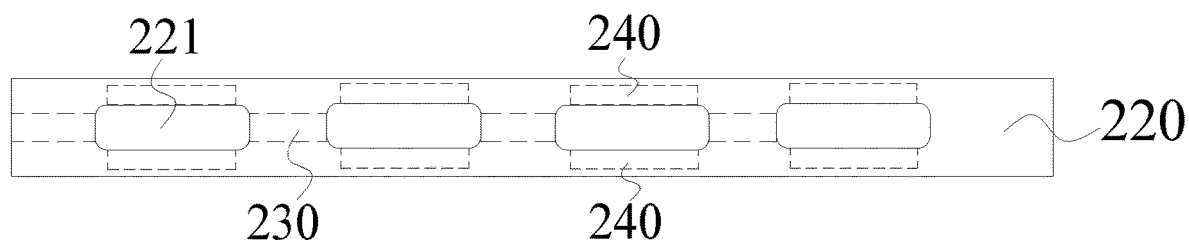
FIG. 5 is a schematic top plan view of a pixel channel according to one embodiment of the present disclosure.

In some embodiments, referring to FIG. 5, the channel layer 200 may further include a plurality of pixel peripheral electrodes 240, and each of the pixel peripheral electrodes 240 surrounds one sub-pixel groove 221, a first liquid storage structure 211, or a second liquid storage structure. As such, before the moving electrode 230 electrically drives the movement of the ink droplet, the pixel peripheral electrode 240 may first raise the liquid level of the ink droplet in the sub-pixel groove 221, the first liquid storage structure 211 or the second liquid storage structure 212, thereby facilitating the movement of the ink droplet under electric driving.

In one embodiment, the plurality of pixel peripheral electrodes comprises first pixel peripheral electrodes, second pixel peripheral electrodes and a third pixel peripheral electrode and each of the first pixel peripheral electrodes surrounds one of the plurality of second liquid storage structures, each of the second pixel peripheral electrodes surrounds one of the plurality of sub-pixel grooves, the third pixel peripheral electrode surrounds the first liquid storage structure.

Step S200 includes printing ink droplets to the liquid storage portion, and moving the ink droplets into the sub-pixel grooves by applying a moving voltage to the moving electrodes.

Figure 3:
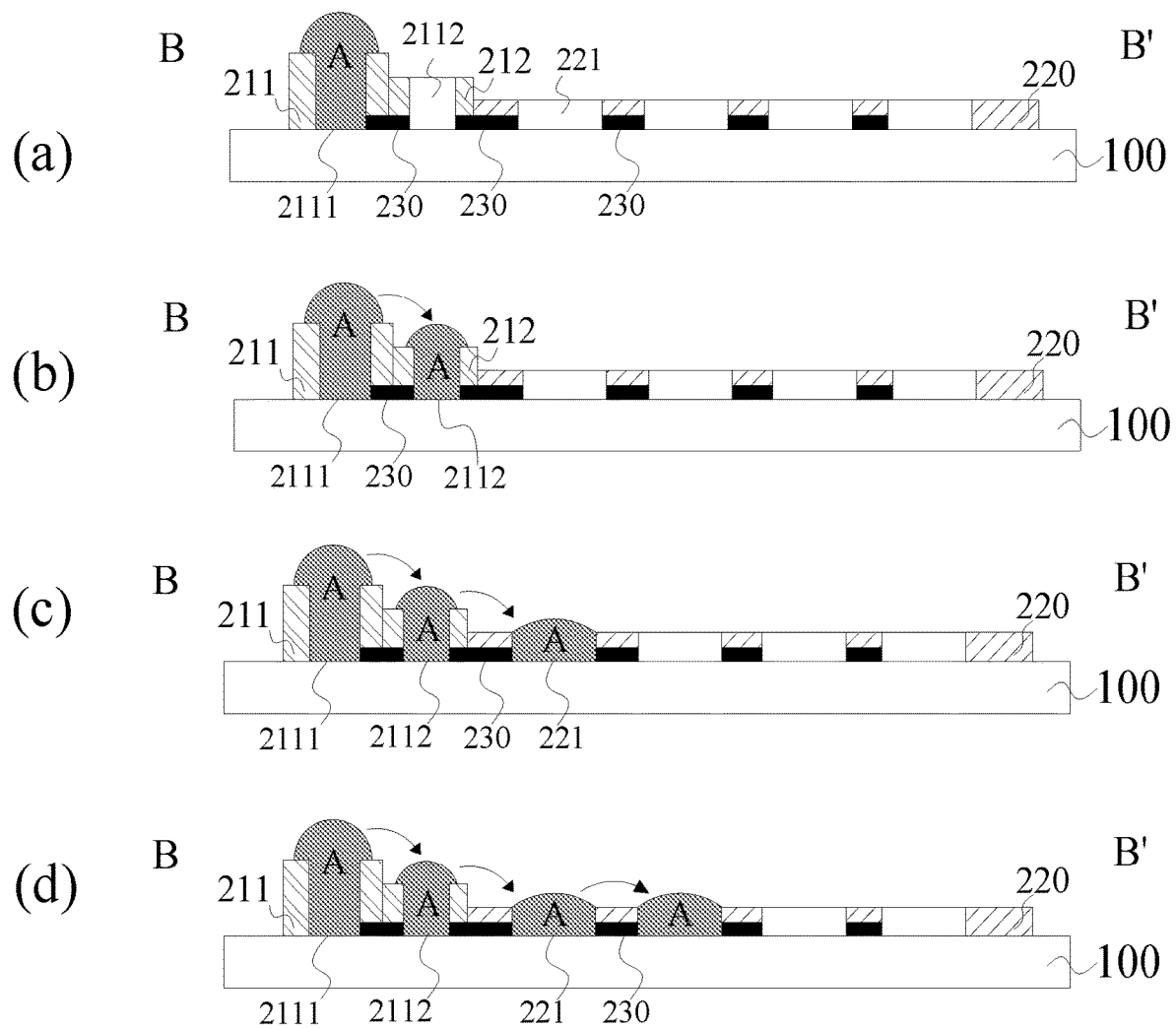
FIG. 3 is a schematic view showing a movement process of an ink droplet driven by an electric field of a moving electrode according to one embodiment of the present disclosure.

In this step, referring to FIG. 3, the ink droplets A are printed into the liquid storage portion 210 in the channel layer 200 prepared in step S100, and then a moving voltage Em is applied to the moving electrodes 230, so that the ink droplets A are moved into the sub-pixel grooves 221.

In some embodiments of the present disclosure, with particular reference to FIG. 3a and FIG. 3b, the ink droplets A are first printed to a plurality of first liquid storage structures 211 respectively, and then a moving voltage Em is applied to the third moving electrodes 2303 to move the ink droplets A into the second liquid storage structures 212. Furthermore, referring to FIG. 3c and FIG. 3d, a moving voltage Em is applied to the first moving electrodes 230 at least one time, so that the ink droplets A are moved into the sub-pixel grooves 221.

Figure 6:
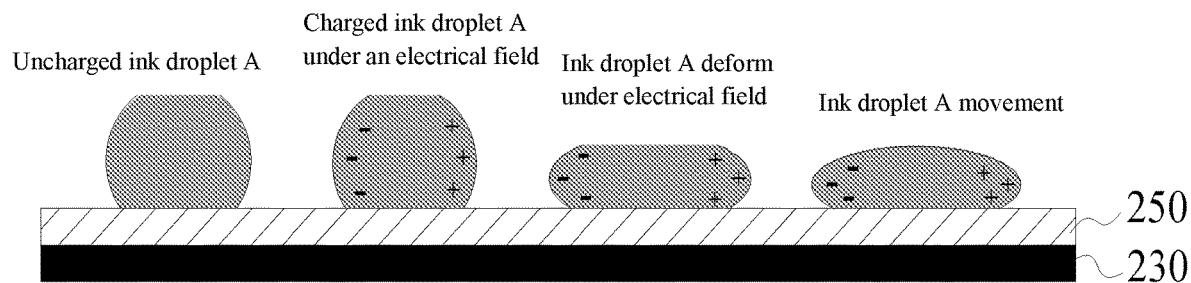
FIG. 6 is a schematic diagram of principle of driving an uncharged ink droplet by a moving electrode according to one embodiment of the present disclosure.

According to one embodiment of the present disclosure, the ink droplets A may be charged or uncharged, and those skilled in the art may select accordingly according to the electrical characteristics of the ink droplets A itself. In some embodiments of the present disclosure, the ink droplets A may be uncharged. Thus, referring to FIG. 6, the uncharged ink droplets A are electrostatically induced to be charged by the electric field of the powered moving electrode 230, and is deformed in a direction perpendicular to the moving electrode 230, thereby causing movement.

Figure 7:
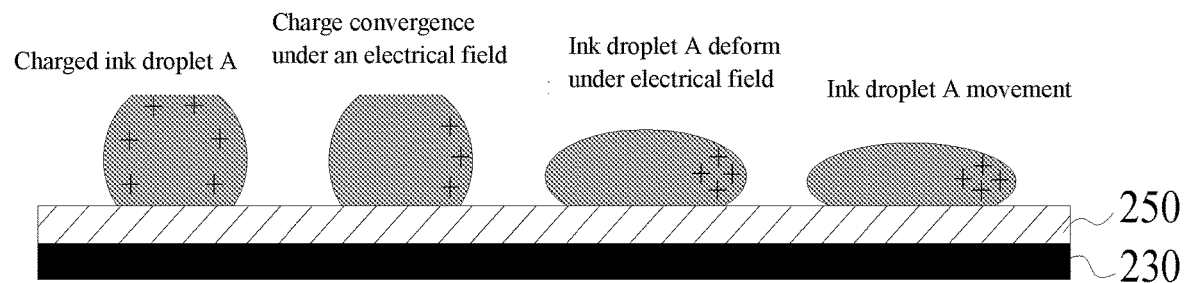
FIG. 7 is a schematic diagram of principle of driving a charged ink droplet by a moving electrode according to one embodiment of the present disclosure.

In some embodiments of the present disclosure, the ink droplets A may be charged, and the charge polarity of the ink droplets A may be opposite to the charge polarity of the moving voltage Em. Thus, with reference to FIG. 7, for example, positively charged ink droplets A generate charge convergence under the action of the electric field of the negatively applied moving electrode 230, and are deformed in a direction perpendicular to the moving electrode 230, thereby causing movement. In some embodiments of the present disclosure, the charged ink droplets A may be such that the ink droplets A are positively or negatively charged through the nozzle of the apparatus, so that the ink droplets A may be directionally moved by applying an electrically opposite pulse voltage to the moving electrode 230. According to one embodiment of the present disclosure, the specific voltage value of the moving voltage Em is not particularly limited, and those skilled in the art can select and adjust according to the actual charge amount of the ink droplets A, the droplet size, and the actual length of the moving electrode 230, which are not repeated here.

According to one embodiment of the present disclosure, the specific types of the light-emitting materials in the ink droplets A are different, for example, a red light-emitting material, a green light-emitting material or a blue light-emitting material, etc., and those skilled in the art can design accordingly according to the distribution of sub-pixels on the display backplate. In some embodiments of the present disclosure, the light-emitting material in the first ink droplet may be a red light-emitting material, such that, at first, referring to FIG. 4, the first ink droplet in the first liquid storage structure 211 (not shown) is moved from a first liquid storage structure 211 to three second liquid storage structures 212 under electrical actuation of the third moving electrodes 2303.

In some embodiments of the present disclosure, the moving voltage Em may be a pulse voltage. Among the plurality of second moving electrodes 2302 in the same pixel channel 220, the pulse voltage is sequentially scanned one by one from the second moving electrode 2302 remote from the liquid storage portion 210 to the second moving electrode 230 near the liquid storage portion 210, so that the number of sub-pixel grooves of the same pixel channel 220 filled with a portion of the ink droplets A increases by one every time the pulse voltage is scanned through the second moving electrodes once. The scanning of the same pulse voltage Em on the second moving electrodes is then repeated several times until all of the sub-pixel grooves 221 in the same pixel channel 220 are filled with a portion of ink droplets A.

In some embodiments of the present disclosure, step S200 may further include: alternately applying a liquid level boosting voltage Eu to the pixel peripheral electrode 240 and applying a moving voltage Em to the moving electrode 230 at least once through the pulse voltage. That is, a liquid level boosting voltage Eu is applied to all of the pixel peripheral electrodes 240 to increase the liquid level of the ink droplets A in all the sub-pixel grooves 221. Then, a pulsed moving voltage Em is applied one by one from the moving electrode 230 away from the liquid storage portion 210 to the moving electrode 230 near the liquid storage portion 210. As such, the pulse liquid level boosting voltage Eu and the pulse moving voltage Em are alternately applied, so that finally the ink droplets A are filled in all the sub-pixel grooves 221 in the same pixel channel 220.

In some embodiments, step S200 may further include: applying a liquid level boosting voltage Eu to the pixel peripheral electrode 240 corresponding to the first sub-pixel groove, so that the liquid level of the ink droplets A in the first sub-pixel groove is first raised, and then a moving voltage Em is applied to the second moving electrode 2302 connecting the first sub-pixel groove and the second sub-pixel groove, so that the ink droplets A are moved from the first sub-pixel groove to the second sub-pixel groove. The second sub-pixel groove is adjacent to the first sub-pixel groove and both are located in the same pixel channel, and the second sub-pixel groove is located on a side of the first sub-pixel groove opposite from the liquid storage portion. As such, the directional movement of the droplets A in the same pixel channel is thus achieved, and the above steps are repeated until the ink droplets A fill all of the sub-pixel grooves 221 in the same pixel channel 220.

In some embodiments of the present disclosure, step S200 may further include: alternately applying a liquid level boosting voltage Eu to all of the pixel peripheral electrodes 240 and applying a moving voltage Em to all of the moving electrodes 230 so that each sub-pixel groove 221 in the plurality of pixel channels 220 is filled with a portion of ink droplets. In this way, the ink droplets A in the same pixel channel 220 can also be simultaneously directionally moved until the ink droplets A fill all the sub-pixel grooves 221 in the same pixel channel 220, thereby saving time.

According to one embodiment of the present disclosure, the specific voltage value of the liquid level boosting voltage Eu is not particularly limited, and those skilled in the art can select according to the actual charge amount of the ink droplets A, the ink droplet size, and the actual depth of the sub-pixel groove 221, which are not repeated here. In some embodiments of the present disclosure, for the ink droplets A having electrical charges, the charge polarity of the ink droplets A may be the same as that of the liquid surface boosting voltage Eu. As such, based on the principle of mutual exclusion of the same kind of charges, the charged pixel peripheral electrode 240 can raise the liquid level of the charged ink droplets A in the sub-pixel grooves 221, thereby facilitating the movement of the ink droplets by the moving electrode 230.

In some embodiments, referring to FIG. 4, a pulsed moving voltage may be applied only to the moving electrode in the red sub-pixel channel 2201 at first, so that the first ink droplets fills the sub-pixel grooves in the red pixel channel 2201. Then, step S200 is repeated to fill the second ink droplets containing the green light-emitting material into the sub-pixel grooves in the green pixel channel 2202. Then, steps S200 is repeated to fill the third ink droplets containing the blue light-emitting material into the sub-pixel grooves in the blue pixel channel 2203. In this way, the printing process of the RGB light-emitting layer can be completed in three B times, thereby realizing solution printing of the light-emitting layers of the plurality of sub-pixels on the backplate of the OLED display with high pixel count.

In one embodiment, each of the plurality of second liquid storage structures is connected to three pixel channels, and the three pixel channels comprises a red pixel channel having a plurality of red sub-pixel grooves, a green pixel channel having a plurality of green sub-pixel grooves, and a blue pixel channel having a plurality of blue sub-pixel grooves.

In one embodiment, moving the ink droplets into the plurality of sub-pixel grooves by applying the moving voltage to the moving electrodes comprises applying a first moving voltage to one of the first moving electrodes so that some of the ink droplets moves from the liquid storage portion to one of the plurality of pixel channels and applying a second moving voltage to the second moving electrodes in the one of the plurality of pixel channels, so that the plurality of sub-pixel grooves in the one of the plurality of pixel channels are filled with a portion of the ink droplets, respectively.

In one embodiment, the first liquid level boosting voltage, the second liquid level boosting voltage, and the third liquid level boosting voltage are the same; and the first moving voltage, the second moving voltage, and the third moving voltage are the same In some embodiments of the present disclosure, after the step S200, the fabricating method may further include:

Step S300 includes drying the substrate filled with the ink droplets comprising a light-emitting material in the sub-pixel grooves to obtain a light-emitting layer filled in each of the sub-pixel grooves.

Figure 9:
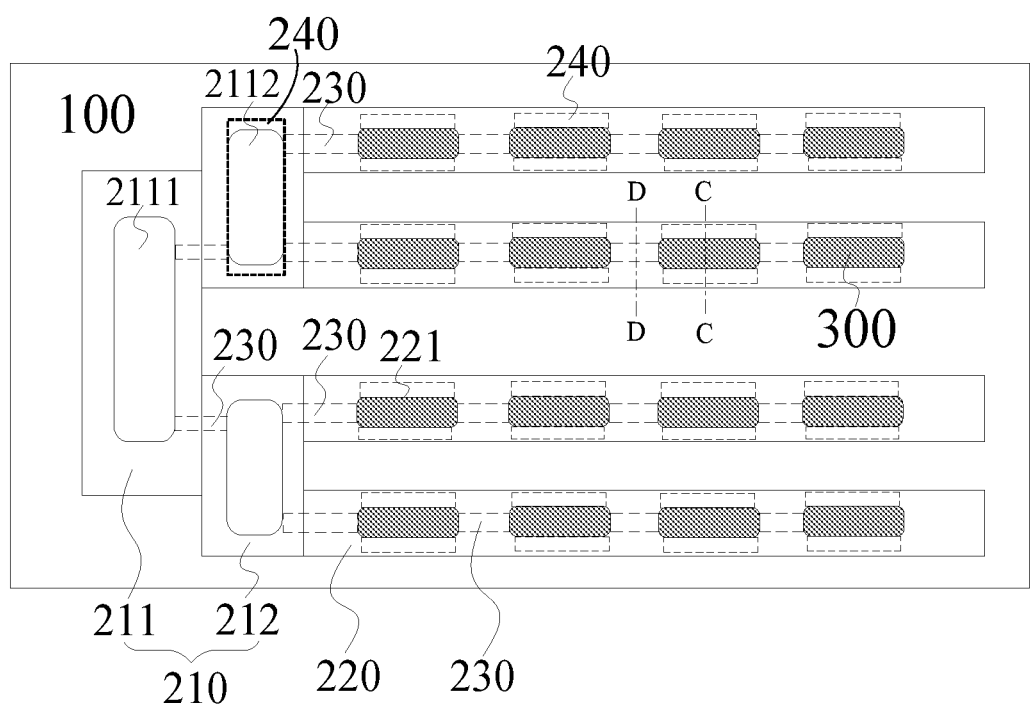
FIG. 9 is a top plan view showing a display backplate according to one embodiment of the present disclosure.

In this step, the substrate in which the ink droplet A is filled in the sub-pixel grooves 221 completed in step S200 is subjected to a drying process to obtain the light-emitting layer 300 filled in each of the sub-pixel grooves 221. Refer to FIG. 9 for the product obtained in this step. According to one embodiment of the present disclosure, the specific process parameters of the drying process, specifically, the temperature, time, and the like of the drying process, etc., can be selected and adjusted according to actual material and size of the ink droplet A, which is not repeated herein.

In one embodiment, the ink droplets comprises a quantum dot, the method further comprises drying the substrate filled with the ink droplets in the sub-pixel grooves, thereby obtaining a color filter layer comprising the quantum dot in each of the sub-pixel grooves.

In some embodiments of the present disclosure, after the step S300, the fabricating method may further include:

Step S400 includes cutting off the area of the liquid storage portion on the substrate to obtain a display backplate.

In this step, the area of the substrate where the liquid storage portion 1M is located after drying in step S300 is cut off to retain the area of the display backplate where the pixel channels are located. The product obtained in this step can be referred to FIG. 8.

Some embodiments of the present disclosure provide a fabricating method for forming a channel layer having a liquid storage portion and driving the ink droplets from the liquid storage portion to sub-pixel grooves in the pixel channels by an electric field so that the printing step of the light-emitting layer can be realized. Thus, the light-emitting layer produced by the ink-jet printing can make the number of pixels of the display backplate higher than 1000 ppi, thereby enabling the solution method to print a high pixel count OLED display backplate.

One embodiment of the present disclosure provides a display backplate.

Figure 8:
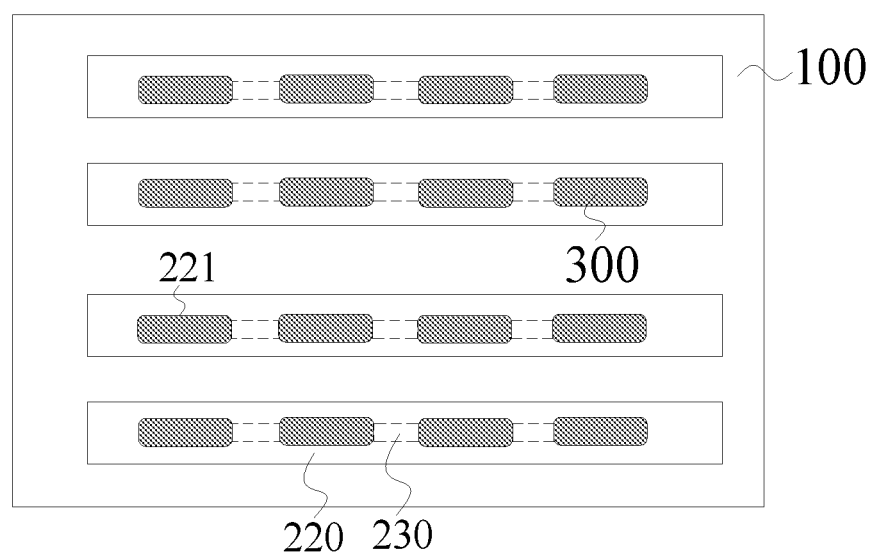
FIG. 8 is a top plan view showing a display backplate according to one embodiment of the present disclosure.

According to one embodiment of the present disclosure, referring to FIG. 8, the backplate includes a substrate 100, a channel layer, and a light emitting layer 300. The channel layer is disposed on one side of the substrate 100, and the channel layer includes a plurality of pixel channels 220 and a plurality of moving electrode 230. Each of the pixel channels 220 has a plurality of sub-pixel grooves 221, and two adjacent sub-pixel grooves 221 are connected. Second moving electrodes are between adjacent sub-pixel grooves in a same pixel channel. The light emitting layer 300 is filled in each of the sub-pixel grooves 221. Thus, the light-emitting layer 300 of the OLED display backplate of the high pixel count can be printed by the electric driving action of the moving electrode 230 between the adjacent sub-pixel grooves 221.

According to one embodiment of the present disclosure, referring to FIG. 9, the channel layer may further include a liquid storage portion 210, and the liquid storage portion 210 is connected to the plurality of pixel channels 220. The moving electrode 230 is between the liquid storage portion 210 and the plurality of pixel channels 220. In this way, the ink droplets of the inkjet device can be printed directly in the liquid storage portion 210, and then the ink droplets in the liquid storage portion 210 are moved into the plurality of sub-pixel grooves 221 by the electric driving action of the moving electrode 230, thereby realizing refinement of the ink droplets by shunting or splitting flow.

In some embodiments of the present disclosure, it may be a two-stage liquid storage structure, and the liquid storage portion 210 includes at least one first liquid storage structure 211 and a plurality of second liquid storage structures 212. Each of the first liquid storage structures 211 is connected to a plurality of second liquid storage structures 212, and each of the second liquid storage structures 212 is connected to a plurality of pixel channels 220. In one embodiment, the channel layer further comprises first moving electrodes and third moving electrodes, each of the third moving electrodes is between the first liquid storage structure and one of the plurality of second liquid storage structures, each of the first moving electrodes is between each of the plurality of second liquid storage structures and one of plurality of pixel channels. As such, by the electric driving action of the moving electrodes 230, the ink droplets in the second liquid storage structure 212 can be further moved into the sub-pixel grooves 221, thereby realizing the electrical printing of the light emitting layer 300.

In some embodiments, referring to FIG. 4, each of the first liquid storage structures 211 may be connected to three second liquid storage structures 212, and each of the second liquid storage structures 212 may be further connected to three pixel channels 220, such that, three colors of light emitting layers in the red pixel channel 2201, the green pixel channel 2202 and the blue pixel channel 2203 respectively are printed out. Thus, a display backplate with the number of pixels higher than 1000 ppi can be ink-jet printed. Furthermore, a RGB display mode can be directly selected without disposing color films, thereby reducing the operating voltage and power consumption of the display apparatus.

In some embodiments of the present disclosure, the liquid storage portion may also be a three-stage or higher liquid storage structure, specifically, for example, a three-stage liquid storage structure. Each of the second liquid storage structures 212 may be connected to a plurality of third liquid storage structures through moving electrodes 230, and each of the third liquid storage structures may be connected to a plurality of pixel channels 220 through moving electrodes 230, thus, after the shunting three or more times, electrical printing of a higher number of pixels of the luminescent layer can be achieved.

In some embodiments, referring to FIG. 9, each of the first liquid storage structures 211 may have a first liquid storage tank 2111, each of the second liquid storage structures 212 may have a second liquid storage tank 2112. The cross-sectional dimension of the first liquid storage tank 2111 may be about 40 to 60 micrometers×about 40 to 60 micrometers, and a volume of the first liquid storage tank 2111 may be the sum of volumes of three second liquid storage tanks. As such, sufficient ink droplets can be printed in the first liquid storage tank 2111 and shunted into the second storage tank 2112 under the electrical drive of the moving electrodes 230.

In some embodiments, referring to FIG. 3, the height of the second liquid storage structure 212 may be smaller than the height of the first liquid storage structure 211 and may be greater than the height of the pixel channel 220. As such, the height difference is more favorable for the directional movement of the liquid droplets. In some embodiments, referring to FIG. 10, the surface of the plurality of moving electrodes 230 opposite from the substrate 100 may be covered with a hydrophobic insulating layer 250, such that the charged moving electrode 230 is completely insulated from the ink droplets to ensure the directional movement of the ink droplets.

In Some Embodiments of the Present Disclosure, Referring to FIG. 5, the Printed channel layer may further include a plurality of pixel peripheral electrodes 240. Each of the pixel peripheral electrodes 240 surrounds a sub-pixel groove 221, a first liquid storage structure 211, or a second liquid storage structure 212, such that the levels of ink droplets are raised before the ink droplets are electrically driven by the moving electrode 230, thereby facilitating the directional movement of the ink droplets.

Figure 10:
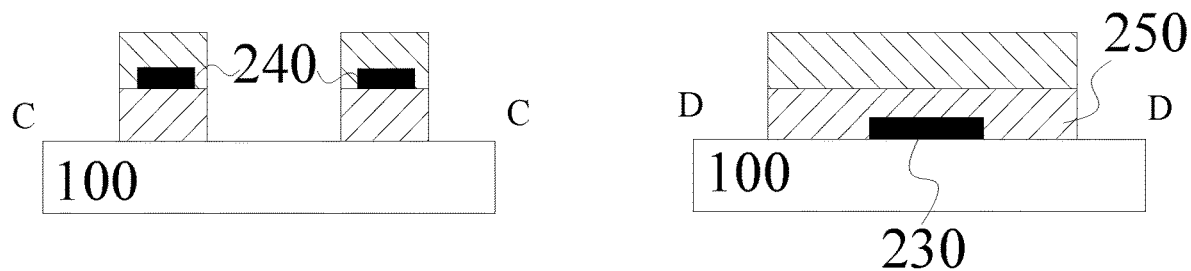
FIG. 10 is a schematic illustration of positional relationship of a pixel peripheral electrode and a moving electrode according to one embodiment of the present disclosure.
Figure 11:
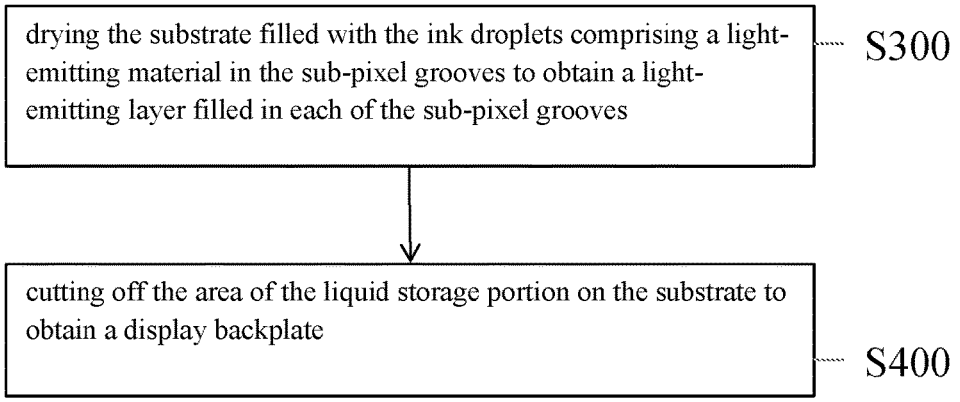

In some specific examples, referring to FIG. 10, the pixel peripheral electrode 240 and the moving electrode 230 are disposed in different layers and insulated from each other, and thus, it is further ensured that the liquid level elevation and movement of the ink droplets do not interfere with each other.

In some embodiments of the present disclosure, the quantum dot material forming the light-emitting layer 300 may be doped with scattering particles having a particle diameter of 50 nm or less, for example, scattering particles having a particle diameter of 15 to 20 nm. As such, the emitted light can be refracted multiple times, thereby increasing the optical path of the outgoing light and accordingly increasing the luminous efficiency of the display backplate.

Some embodiments of the present disclosure provide a display backplate in which moving electrodes are disposed between sub-pixel grooves of a pixel channel in a printed channel layer, so that in the process of fabricating a display backplate, the ink droplets can be directionally moved between the sub-pixel grooves by electrically driving of the moving electrodes. As such, the number of pixels of the display backplate printed by the inkjet may be higher than 1000 ppi.

In the description of the present disclosure, it is to be understood that the terms indicating orientation or positional relationships such as "center", "longitudinal", "transverse", "length", "width", "thickness", "upper", "lower", "front", "Rear," "Left," "right," "vertical," "horizontal," "top," "bottom," "inner," "Out," "Clockwise," "Counterclockwise." "axial," "radial", "circumferential" and the like, are based on the orientation or positional relationship shown in the drawings, and are merely for the convenience of describing the present disclosure and simplifying the description, and do not indicate or imply the indicated device or the elements must have a particular orientation, are constructed and operated in a particular orientation and are therefore not to be construed as limiting.

In the description of the present disclosure, the terms "mounted," "connected," "fixed," and the like are to be understood broadly, and may be, for example, a fixed connection or the connection may be disassembled or integrated; it may be a mechanical connection or an electrical connection; it may be directly connected or indirectly connected through an intermediate medium, and may be an internal connection of two elements or an interaction relationship of two elements. For those skilled in the art, the specific meanings of the above terms in the present disclosure can be understood on a case-by-case basis.

Moreover, the terms "first" and "second" are used for descriptive purposes only and are not to be construed as indicating or implying a relative importance or implicitly indicating the number of technical features indicated. Thus, features defining "first" or "second" may include at least one of the features, either explicitly or implicitly. In the description of the present disclosure, the meaning of "a plurality" is at least two, such as two, three, etc., unless specifically defined otherwise.

In the description of the present specification, the description with reference to the terms "one embodiment", "some embodiments", "example", "specific example", or "some examples" and the like means a specific feature described in connection with the embodiment or example. A structure, material or feature is included in at least one embodiment or example of the disclosure. In the present specification, the schematic representation of the above terms is not necessarily directed to the same embodiment or example. Furthermore, the particular features, structures, materials, or characteristics described may be combined in a suitable manner in any one or more embodiments or examples. In addition, those skilled in the art can combine and combine the different embodiments or examples described in the specification and the features of different embodiments or examples, without contradicting each other.

Although the embodiments of the present disclosure have been shown and described, it is understood that the above-described embodiments are illustrative and are not to be construed as limiting the scope of the disclosure. The embodiments are subject to variations, modifications, substitutions and variations.

What is claimed is:

1. A method of fabricating a display backplate, comprising:
   forming a channel layer on a surface of a substrate, the channel layer comprising a liquid storage portion, a plurality of pixel channels, and a plurality of moving electrodes, each of the plurality of pixel channels comprising a plurality of sub-pixel grooves, the plurality of moving electrodes comprising first moving electrodes and second moving electrodes, each of the first moving electrodes is between the liquid storage portion and one of the plurality of pixel channels, each of the second moving electrodes is between adjacent sub-pixel grooves;
   printing ink droplets into the liquid storage portion; and
   moving the ink droplets into the plurality of sub-pixel grooves by applying a moving voltage to the moving electrodes;
   wherein the liquid storage portion comprises a first liquid storage structure and a plurality of second liquid storage structures, the first liquid storage structure is connected to the plurality of second liquid storage structures, the moving electrodes further comprises third moving electrodes, each of the third moving electrodes is between the first liquid storage structure and one of the plurality of second liquid storage structures, and each of the plurality of second liquid storage structures is connected to more than one of the plurality of pixel channels, each of the first moving electrodes is between one of the plurality of second liquid storage structures and one of the plurality of pixel channels, and
   printing the ink droplets into the liquid storage portion comprises printing the ink droplets into the first liquid storage structure.

2. The method of claim 1, wherein moving the ink droplets into the plurality of sub-pixel grooves by applying the moving voltage to the moving electrodes comprises:
   applying a first moving voltage to one of the first moving electrodes so that some of the ink droplets moves from the liquid storage portion to one of the plurality of pixel channels;
   applying as second moving voltage to the second moving electrodes in the one of the plurality of pixel channels, so that the plurality of sub-pixel grooves in the one of the plurality of pixel channels are filled with a portion of the ink droplets, respectively.

3. The method of claim 1, wherein each of the plurality of second liquid storage structures is connected to three pixel channels, and the three pixel channels comprises a red pixel channel having a plurality of red sub-pixel grooves, a green pixel channel having a plurality of green sub-pixel grooves, and a blue pixel channel having a plurality of blue sub-pixel grooves.

4. The method of claim 1, wherein the channel layer further comprises a plurality of pixel peripheral electrodes, the plurality of pixel peripheral electrodes comprises first pixel peripheral electrodes, second pixel peripheral electrodes and a third pixel peripheral electrode and each of the first pixel peripheral electrodes surrounds one of the plurality of second liquid storage structure, each of the second pixel peripheral electrodes surrounds one of the plurality of sub-pixel grooves, the third pixel peripheral electrode surrounds the first liquid storage structure.

5. The method of claim 4, wherein moving the ink droplet into the plurality of sub-pixel grooves by applying the moving voltage to the moving electrodes comprises:
applying a first liquid level boosting voltage to the third pixel peripheral electrode surrounding the first liquid storage structure, thereby raising a liquid level of the ink droplets in the first liquid storage structure; and
applying a third moving voltage to the third moving electrodes between the first liquid storage structure and the plurality of the second liquid storage structures, thereby moving some of the ink droplets from the first liquid storage structure into the plurality of second liquid storage structures connected to the first liquid storage structure;
applying a second liquid level boosting voltage to each of the first pixel peripheral electrodes surrounding the plurality of second liquid storage structures connected to the first liquid storage structure, thereby raising a liquid level of the ink droplets in each of the plurality of second liquid storage structures; and
applying a first moving voltage to each of the first moving electrodes between the plurality of the second liquid storage structures and the plurality of pixel channels, thereby moving the ink droplets sequentially from the plurality of second liquid storage structures into the plurality of sub-pixel grooves in the plurality of pixel channels connected to the plurality of second liquid storage structures;
applying a third liquid level boosting voltage to each of the second pixel peripheral electrodes surrounding the first sub-pixel grooves, thereby raising a liquid level of the ink droplets in each of the first sub-pixel grooves, and
applying a second moving voltage to each of the second moving electrodes between the adjacent sub-pixel grooves, thereby moving some of ink droplets from one of the sub-pixel grooves to another adjacent one of sub-pixel grooves sequentially.

6. The method of claim 5, wherein the first liquid level boosting voltage, the second liquid level boosting voltage, and the third liquid level boosting voltage are the same; and the first moving voltage, the second moving voltage, and the third moving voltage are the same.

7. The method of claim 5, wherein the ink droplets are charged, charge polarity of the ink droplets is opposite to charge polarity of the first moving voltage, the second moving voltage, and the third moving voltage, and the charge polarity of the ink droplets is the same as charge polarity of the liquid level boosting voltage.

8. The method of claim 1, wherein the ink droplets comprises a light-emitting material, the method further comprising:
drying the substrate filled with the ink droplets in the sub-pixel grooves, thereby obtaining a light-emitting layer in each of the sub-pixel grooves.

9. The method of claim 1, wherein the ink droplets comprises a quantum dot, the method further comprising:
drying the substrate filled with the ink droplets in the sub-pixel grooves, thereby obtaining a color filter layer comprising the quantum dot in each of the sub-pixel grooves.

10. The method of claim 1, further comprising:
cutting off a region of substrate where the liquid storage portion is, thereby obtaining the display backplate comprising the plurality of pixel channels and the plurality of second moving electrodes.

11. A display backplate, comprising:
a substrate;
a channel layer on a surface of the substrate, the channel layer comprising a plurality of pixel channels, each of the pixel channels comprising a plurality of sub-pixel grooves, and second moving electrodes between adjacent sub-pixel grooves in a same pixel channel; and
a sub-pixel layer in each of the plurality of sub-pixel grooves respectively;
wherein the sub-pixel layer comprises a light-emitting material or a quantum dot.

12. The display backplate of claim 11, wherein the channel layer further comprises a plurality of pixel peripheral electrodes and a plurality of spacers, and each of the pixel peripheral electrodes respectively surrounds one of the sub-pixel grooves, and each of the plurality of spacers is configured to separate two adjacent sub-pixel grooves.

13. The display backplate of claim 12, wherein the pixel peripheral electrodes are disposed in a different layer from the second moving electrodes and insulated from the second moving electrodes.

14. The display backplate of claim 11, wherein the channel layer further comprises a liquid storage portion, and the liquid storage portion is connected to the plurality of pixel channels through first moving electrodes.

15. A display backplate, comprising:
a substrate;
a channel layer on a surface of the substrate, the channel layer comprising a plurality of pixel channels, each of the pixel channels comprising a plurality of sub-pixel grooves, and second moving electrodes between adjacent sub-pixel grooves in a same pixel channel; and
a sub-pixel layer in each of the plurality of sub-pixel grooves respectively,
wherein the channel layer further comprises a liquid storage portion, and the liquid storage portion is connected to the plurality of pixel channels through first moving electrodes; and
the liquid storage portion comprises a first liquid storage structure and a plurality of second liquid storage structures, the first liquid storage structure is connected to the plurality of second liquid storage structures, and each of the plurality of second liquid storage structures is connected to more than one of the plurality of pixel channels.

16. The display backplate of claim 15, wherein a height of one of the second liquid storage structures is smaller than a height of the first liquid storage structure and greater than a height of one of the pixel channels.

17. The display backplate of claim 15, wherein the channel layer further comprises first moving electrodes and third moving electrodes, each of the third moving electrodes is between the first liquid storage structure and one of the plurality of second liquid storage structures, each of the first moving electrodes is between each of the plurality of second liquid storage structures and one of plurality of pixel channels, and a surface of one of the first moving electrodes, the second moving electrodes, or the third moving electrodes opposite from the substrate is covered with a hydrophobic insulating layer.

18. A display apparatus comprising the display backplate of claim 10.

* * * * *